United States Patent [19]
Torresdal

[11] 3,911,253
[45] Oct. 7, 1975

[54] DIGITAL COUNTING METHOD AND APPARATUS

[76] Inventor: David N. Torresdal, 427 Hillcrest Way, Redwood City, Calif. 94082

[22] Filed: Sept. 10, 1973

[21] Appl. No.: 395,507

Related U.S. Application Data

[63] Continuation-in-part of Ser. No. 218,984, Jan. 19, 1972, abandoned.

[52] U.S. Cl....... 235/92 FQ; 235/92 TF; 235/92 PL; 235/92 R; 324/79 D

[51] Int. Cl.[2]................... H03K 21/30; G01R 23/02

[58] Field of Search....... 235/92 FQ, 92 PL, 92 CC, 235/92 EA, 92 TF; 324/79 D, 78 D

[56] References Cited

UNITED STATES PATENTS

| | | | |
|---|---|---|---|
| 3,304,504 | 2/1967 | Horlander | 324/79 D |
| 3,353,161 | 11/1967 | Toscano | 235/92 PL |
| 3,681,707 | 8/1972 | Bean | 235/92 FQ |
| 3,728,635 | 4/1973 | Eisenberg | 235/92 CC |
| 3,766,535 | 10/1973 | Deebel | 235/92 FQ |

*Primary Examiner*—Joseph M. Thesz, Jr.
*Attorney, Agent, or Firm*—Flehr, Hohbach, Test, Albritton & Herbert

[57] ABSTRACT

Digital counting method and apparatus in which counts are made during the first half of each counting cycle, then stored in the counters and displayed during the last half of the cycle. In one embodiment, a predetermined number of pulses is subtracted from the count before it is displayed by resetting the counters after the predetermined number of pulses have been counted during the first half of the cycle. In another embodiment, subtraction is effected by diverting the predetermined number of pulses to an auxiliary counter at the outset of the cycle.

4 Claims, 3 Drawing Figures

DIGITAL COUNTING METHOD AND APPARATUS

CROSS-REFERENCE TO RELATED APPLICATION

This is a continuation-in-part of copending application Ser. No. 218,984, filed Jan. 19, 1972, now abandoned.

BACKGROUND OF THE INVENTION

This invention pertains generally to digital counters and more particularly to a digital counting method and apparatus which are particularly suitable for use in displaying the operating frequency of a radio transmitter or receiver.

Radio transmitters and receivers generally have local oscillators which determine the frequencies at which they operate. When operation at more than one frequency is desired, the local oscillator commonly has a variable tuning element, such as a variable capacitor, and the operating frequency is indicated by a mechanical dial connected to the variable element. Although widely used, mechanical dials have certain disadvantages. For example, they are difficult to calibrate and difficult to read accurately. In addition, they are subject to backlash and difficult to preset to a desired frequency.

Heretofore, there have been some attempts to use a frequency counter in connection with the local oscillator to provide a digital indication of the operating frequency of a transmitter or receiver. This approach avoids the problems commonly encountered with mechanical dials. However, when the local oscillator operates at a different frequency than the operating frequency of the transmitter or receiver, the difference in frequency must be subtracted if the counter is to display the operating frequency rather than the oscillator frequency. In one prior approach, a counter first counts down to the difference frequency, then counts up to the oscillator frequency. Other prior approaches require separate storage means and two or more cycles to operate.

SUMMARY AND OBJECTS OF THE INVENTION

In the counter and method of the present invention, the counter is made during a first portion of a counting cycle, then stored in the counter and displayed during a second portion of the cycle. A count is made every cycle, and separate storage means is not required. When the counter is used to display the operating frequency of a transmitter or receiver, any difference between the oscillator frequency and operating frequency is subtracted before the count is displayed. In one embodiment, the subtraction is effected by resetting the counter to its initial level after the difference frequency has been counted during the first portion of the cycle. In another embodiment, the subtraction is effected by diverting a count corresponding to the difference in frequency to an auxiliary counter during the first portion of the cycle.

It is in general an object of the invention to provide a new and improved digital counting method and apparatus.

Another object of the invention is to provide a counting method and apparatus of the above character which are particularly suitable for use in displaying the operating frequency of a radio transmitter or receiver.

Another object of the invention is to provide a counting method and apparatus of the above character in which a count is made during a first portion of each counting cycle and displayed during a second portion of the cycle.

Another object of the invention is to provide a counting method and apparatus of the above character in which subtraction of a predetermined count is effected by resetting the counter to its initial level during the first portion of the counting cycle.

Another object of the invention is to provide a counting method and apparatus of the above character in which subtraction of a predetermined count is effected by diverting the predetermined count to an auxiliary counter during the first portion of the counting cycle.

Additional objects and features of the invention will be apparent from the following description in which the presently preferred embodiment is set forth in detail in conjunction with the accompanying drawings.

DESCRIPTION OF THE PREFERRED EMBODIMENT

Figures 1, 2:
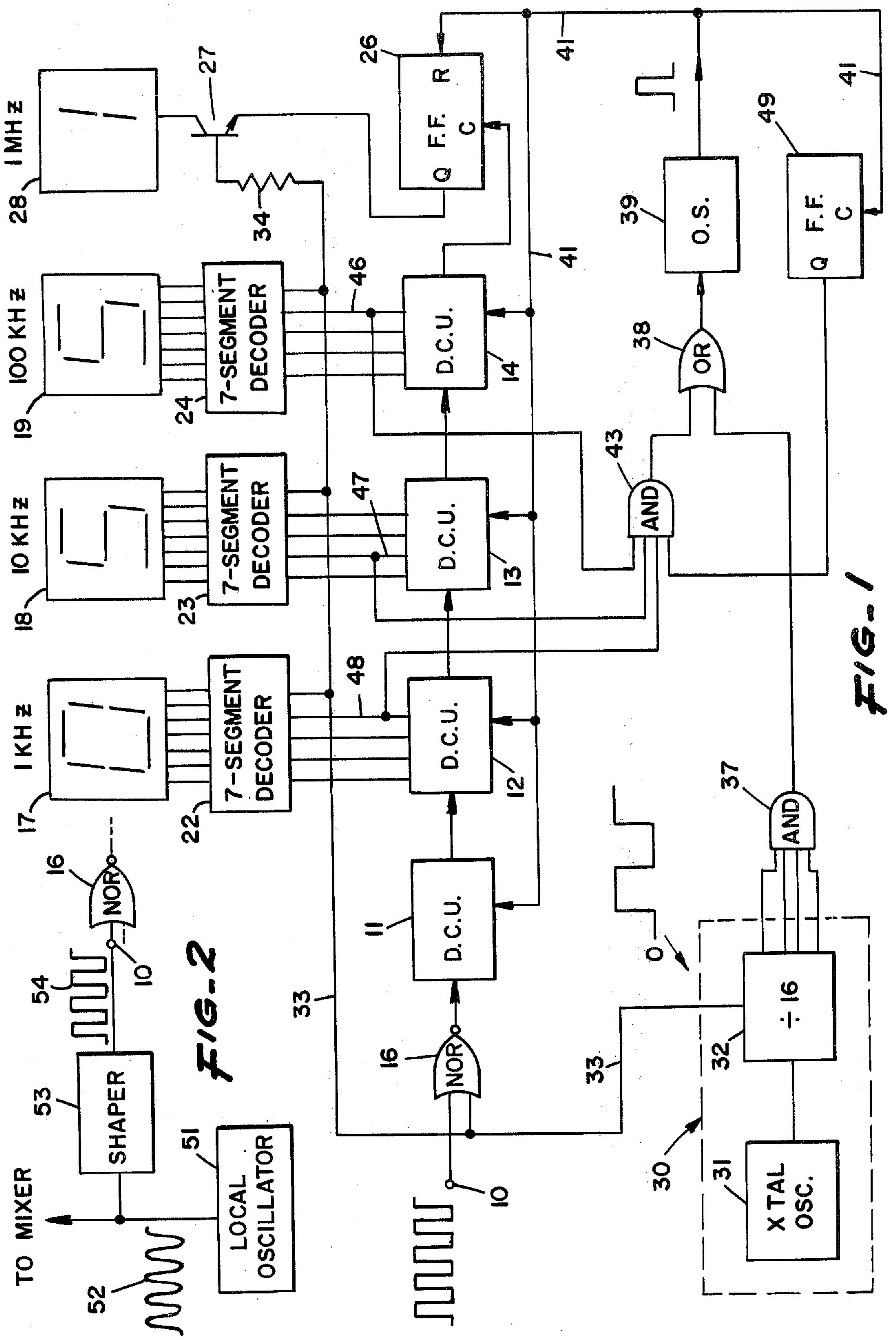
FIG. 1 is a block diagram of one embodiment of a digital counter according to the invention.
FIG. 2 illustrates the manner in which the counter of FIG. 1 can be connected to the oscillator of a radio transmitter or receiver to provide a digital display of the operating frequency of the transmitter or receiver.

As illustrated in FIG. 1, the counting apparatus includes an input terminal 10 and means for counting the number of pulses in a signal received at the input terminal. This means includes a plurality of decade counting units or divide-by-10 counters 11–14 which are connected in series to form a multidigit counter. A NOR gate 16 is connected between the input terminal 10 and the counting units and provides means for controlling the passage of input pulses to the counters. If desired, the function of the NOR gate can be incorporated in the first counter 11. For example, if the first counter is a Texas Instruments' model 7490 or similar unit having an input for locking the counter at a count of 9, this input can be used to prevent the passage of pulses to the succeeding stages.

Means is provided for displaying the count registered in the counting units. This means includes a plurality of seven-segment display elements 17–19 and seven-segment decoders 22–24. The decoders are connected between the counting units 12–14 and the display elements, and they provide means for converting the binary coded decimal outputs of the counting units to the form required to drive the display elements.

The overflow or carry output of the counting unit 14 is connected to the clock input of a flip-flop 26. The Q output of this flip-flop is connected to the emitter of a transistor 27, and the collector of this transistor is connected to an additional seven-segment display element 28. This display element serves as an over-range indicator, and it is connected in such manner that it can only display the digit 1. If desired, the flip-flop 26 and the transistor 27 can be replaced with a decade counting unit and a seven-segment decoder, and the display element 28 can be connected for displaying the full range of digits 0–9. Similarly, additional counting and display stages can be added to extend the range of the instrument and/or increase its resolution.

A source 31 provides a reference signal which controls the operation of the counter. This signal has a square waveform, and it varies between high and low logic levels at a frequency of 50 Hz. As illustrated in FIG. 1, the reference source includes a crystal oscillator 31 and a divide-by-16 counter 32. The frequency of the oscillator can be chosen as desired, and suitable dividers can be added between the output of the oscillator and the input of the counter 32 to make the output of this counter have a frequency of 50 Hz.

The 50 Hz reference signal is delivered to a control line 33 which is connected to one input of the NOR gate 16. This line is also connected to control inputs on the decoders 22–24 and to the base of the transistor 27 through a resistor 34. As is discussed more fully hereinafter, during the half cycle when the reference signal is low, pulses at the input terminal 10 are counted in the counting units 11–14, and the decoders and display elements are turned off. During the other half cycle, the NOR gate blocks the passage of pulses to the counters, and the count stored during the first half cycle is displayed.

Means is provided for resetting the counting units to zero at the end of the half cycle in which the display is made. This means includes an AND gate 37 connected for monitoring the count in the divide-by-16 counter 32. The output of the AND gate 37 is connected to one input of an OR gate 38, and the output of this gate is connected to the input of a one-shot multivibrator. The output of the multivibrator is delivered to a reset line 41 which is connected to the reset inputs of the counting units 11–14 and the flip-flop 26. The duration of the reset pulses produced by the multivibrator is preferably short relative to the width of the pulses at the input terminal. For example, in a counter for use with input frequencies up to about 50 MHz, the reset pulses can have a duration on the order of 30 nanoseconds.

Means is also provided for resetting the counting units to zero when a predetermined count is reached during the first portion of the counting cycle, i.e., the half cycle in which the count is made. As is discussed more fully hereinafter, this permits a predetermined number to be subtracted from the count before it is displayed. This means includes an AND gate 43 connected for monitoring certain of the lines between the counting units and the decoders. These lines are selected according to the number to be subtracted and in the embodiment illustrated, they are chosen to have high logic levels for the number immediately preceding the number to be subtracted. Thus, for example, if the number to be subtracted is 142, the monitored lines can include the "1" line of the counter 14, andn the "4" line 47 of the counter 13, and the "1" line 48 of the counter 12, as illustrated. The monitored lines are connected to the inputs of the AND gate 43, and the output of this gate is connected to the input of the OR gate 38. The AND gate 43 receives an additional input from the Q output of a flip-flop 49 which has its clock input connected to the reset line 41. Depending upon the number to be detected, it may be necessary to monitor additional lines and/or use additional logic elements to determine when the number has been reached.

Operation and use of the apparatus of FIG. 1, and therein the method of the invention, can now be described. During the first half of the counting cycle, the reference signal is low, and pulses at the input terminal 10 pass through the NOR gate 16 and are counted into the counting units 11–14. During this first half cycle, the decoders 22–24 and the transistor 27 are turned off by the reference signal. At the end of the half cycle, the reference signal becomes high, closing the NOR gate 16 and preventing further pulses from entering the counting units. The high level turns on the decoders and the transistor, and the count stored in the counting units during the first half cycle is displayed during the second half cycle. Toward the end of the second half of the cycle, all of the lines between the divide-by-16 counter 32 and the AND gate 37 become high, and the output of this gate becomes high. This makes the output of the OR gate 38 high, setting the one-shot multivibrator 39. When the reference signal returns to its low level at the end of the cycle, the input to the AND gate 37 all go low, making the outputs of the AND gate 37 and OR gate 38 low. This transition of the OR gate output fires the multivibrator 39 which delivers a reset pulse to the line 41, resetting the counters and flip-flop 26 to zero. Since the reset pulse is of short duration, the next counting cycle commences without the loss of any input pulses.

Now let it be assumed that 142 pulses are to be subtracted from the count before it is displayed. The counting cycle begins as described above until 141 pulses have been counted. At this point, the levels on all of the lines monitored by the AND gate 43 are high, as is the Q output of the flip-flop 49. This makes the outputs of the AND gate 43 and the OR gate 38 high, setting the flip-flop 39. On the 142nd pulse, the 1 line 48 of the counter 12 becomes low, making the outputs of the AND gate 43 and the OR gate 38 low. The one-shot multivibrator 39 fires, delivering a reset pulse to the line 41. This pulse resets the counters 11–14 and the flip-flop 26, and it toggles the flip-flop 49, making its Q output low. The count continues throughout the half cycle, with the 143rd pulse being counted as 1 and so on. This time the counter is not reset when the count reaches 141 because the Q output of the flip-flop 49 is low. Thus, even though the levels on all of the monitored lines are high, the output of the AND gate 43 remains low, and the count continues without interruption until the reference signal becomes high at the end of the first half of the cycle. The count is displayed, as before, during the second half of the cycle, and at the end of the cycle a reset pulse resets the counters and flip-flop 26. This reset pulse also toggles the flip-flop 49, making its Q output high, thereby enabling the AND gate 43 to initiate the reset process on the 141st pulse during the first half of the next counting cycle.

The 50 Hz reference signal has a period of 20 milliseconds and the half cycle in which the count is made has a duration of 10 milliseconds or 0.01 second. Thus, the number of input pulses per second is 100 times the number counted during the counting half of the cycle, and the frequency of the input signal is divided by 100 before it reaches the counting stages. The counting units 11–14 each divide the signal by 10 before delivering it to the next succeeding stage. Thus, the counter 12 and display element 17 reach KHz, counter 13 and display element 18 read tens of KHz, counter 14 and display element 19 read hundreds of KHz, and flip-flop 26 and display element 28 read MHz.

The manner in which the apparatus and method described above can be used to provide a digital indication of the operating frequency of a radio transmitter or receiver is illustrated in FIG. 2. Here the invention is shown in connection with a superheterodyne receiver having a local oscillator 51 which is tuned to a frequency above the incoming signal by an amount corresponding to the intermediate frequency of the receiver. The local oscillator typically produces a generally sinusoidal signal 52 which is delivered to a mixer stage in the receiver where it is combined with the incoming signal in a well known manner. A wave shaping circuit 53 is connected to the output of the local oscillator and provides a pulsating signal 54 having the same frequency as the sinusoidal signal 52. The pulsating signal 54 is applied to the input terminal 10 and counted in the manner described above. When the invention is used in this manner, the number of pulses subtracted during the first half of the counting cycle is chosen to correspond to the intermediate frequency of the receiver. For example, the receivers used in automatic direction finders in air navigation commonly have an intermediate frequency of 142.5 KHz, and the local oscillators in these receivers commonly operate at a frequency 142.5 KHz above the frequency of the incoming signal. By subtracting 142 pulses during each counting cycle, the counter displays the frequency of the incoming signal even though it is actually measuring the frequency of the oscillator signal. By subtracting a frequency which differs from the intermediate frequency by an amount corresponding to one-half of the pass band of the receiver, the output of the counter can be centered with respect to the pass band. Thus, for example, with ADF receivers, the frequency subtracted is preferably 142 KHz, rather than the exact IF frequency of 142.5 KHz.

Figure 3:
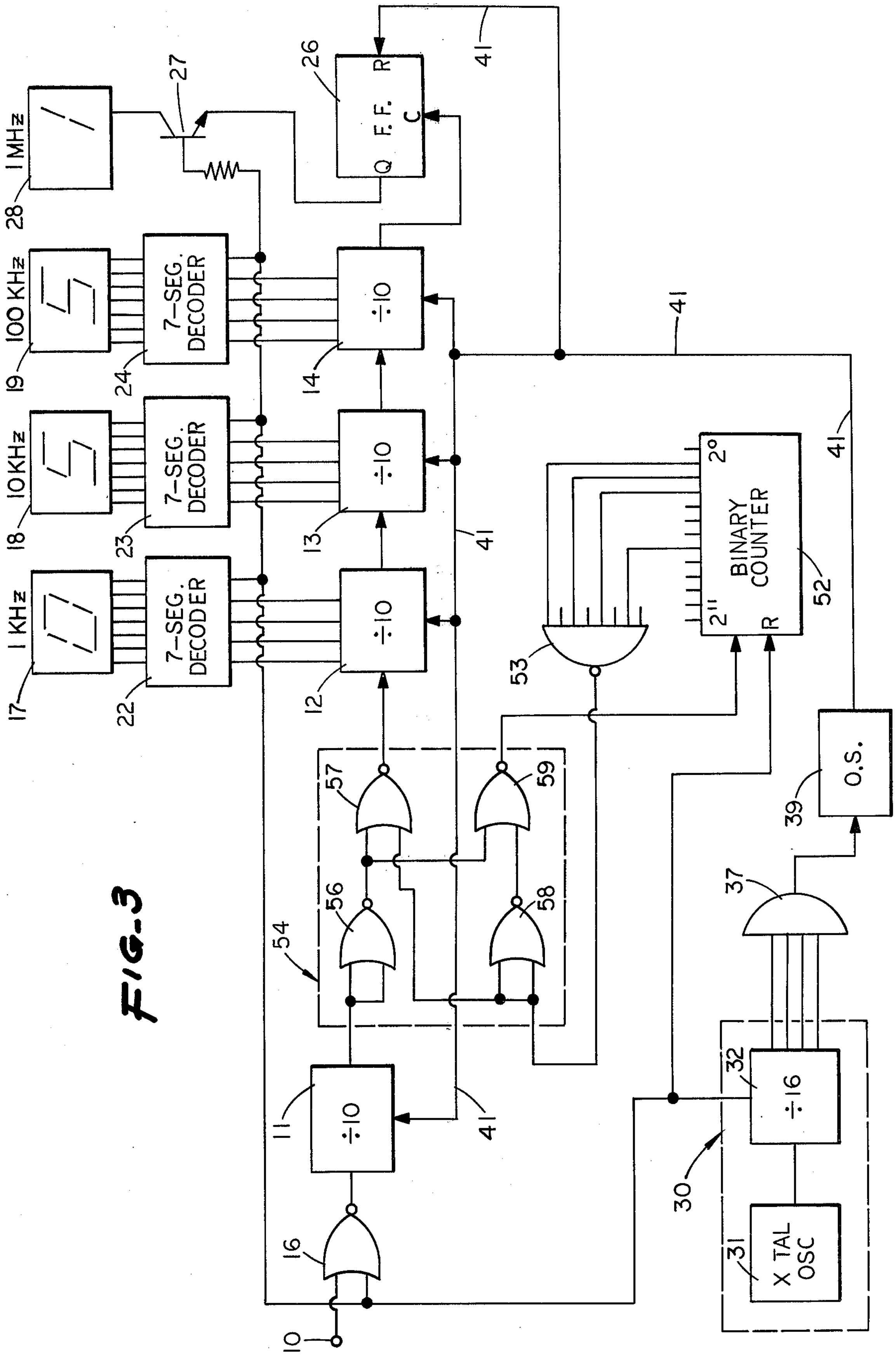
FIG. 3 is a block diagram of a second embodiment of a digital counter according to the invention.

The embodiment illustrated in FIG. 3 is generally similar to the embodiment of FIG. 1, and like reference numerals are used to designate like elements in the two figures. In the embodiment of FIG. 3, however, subtraction is effected by diverting pulses from the counters whose counts are displayed to an additional counter at the outset of the counting cycle. For this purpose, additional gating means 51 is connected between counters 11 and 12, and an additional counter 52 is provided. In the preferred embodiment, counter 52 is a 12-stage binary counter having 12 output lines and a capacity of $2^{11}$ or 2,048 counts. A NAND gate 53 is connected to certain of the output lines from counter 52 to determine when the count in that counter reaches a predetermined level. The output lines are selected according to the number to be subtracted, and in the preferred embodiment they are chosen to have high logic levels when the count reaches the number to be subtracted. Thus, for example, if the number to be subtracted is 142, the $2^1$, $2^2$, $2^3$, and $2^7$ outputs are monitored, as illustrated.

Gating means 54 comprises NOR gates 56–59. The output of counter 11 is connected to both inputs of gate 56, and the output of this gate is connected to one input of NOR gate 57 and one input of NOR gate 59. The output of NAND gate 53 is connected to a second input of NOR gate 57 and to both inputs of NOR gate 58. The output of NOR gate 58 is connected to a second input of NOR gate 59. The output of NOR gate 57 is connected to the input of counter 12, and the output of NOR gate 59 is connected to the input of counter 52. The reset input of counter 52 is connected to reset line 41.

Operation and use of the embodiment of FIG. 3, and therein the method of the invention, can now be described. As before, it is assumed that 142 pulses are to be subtracted from the count before it is displayed. During the first half of each counting cycle, the reference signal from divide-by-16 counter 32 is low, and pulses at input terminal 10 pass through NOR gate 16 to counter 11. At the outset of this half cycle, i.e., before the count in counter 52 reaches 142, the output of NAND gate 53 is high, and gating means 54 diverts the output of counter 11 to the input of counter 52. When counter 52 reaches a count of 142, the output lines connected to NAND gate 53 all become high, and the output of the NAND gate becomes low. The pulses from counter 11 can now pass through NOR gate 57, and they are applied to counters 12–14 for the remainder of the first half cycle of the reference signal. At the end of this half cycle, the reference signal becomes high, closing NOR gate 16 and preventing further pulses from entering any of the counters. During the second half of the cycle, the count stored in counters 12–14 is displayed as in the embodiment of FIG. 1. At the end of the second half cycle, counter 52 is reset along with counters 11–14 and flip-flop 26.

Like the embodiment of FIG. 1, the embodiment of FIG. 3 is particularly suitable for indicating the operating frequency of a radio transmitter or receiver. For this purpose, the counting apparatus is connected to the oscillator of the transmitter or receiver in the manner illustrated in FIG. 2 and described above.

The counting apparatus and method described above have a number of advantages. A count is made and displayed during every counting cycle. Since the count is made only during the first half of the cycle, it can be stored in the counters during the second half of the cycle, and no additional storage means is needed. Any desired number can be subtracted from the count while it is being made and before it is displayed. No additional operating cycles or storage means is required for the subtraction. Utilizing commercially available integrated circuits, the entire instrument can be constructed as a compact, lightweight unit which is readily installed in a small area, such as an instrument panel of an aircraft. The embodiment of FIG. 3 has a further advantage in that all programming for the number to be subtracted is done with outputs of a single counter. This embodiment can be used at higher frequencies because it does not require a reset pulse during the counting portion of the cycle for subtraction.

It is apparent from the foregoing that a new and improved digital counting method and apparatus have been provided. While only the presently preferred embodiment has been described herein, as will be apparent to those familiar with the art, certain changes and modifications can be made without departing from the scope of the invention as defined by the following claims.

I claim:

1. In digital counting apparatus, an input terminal for receiving a pulsating input signal, pulse counting means for counting the number of pulses applied thereto, means for providing a periodic reference signal which varies cyclically between first and second levels at a predetermined rate, gate means responsive to the reference signal for applying the input signal to the counting means when the reference signal is at its first level and inhibiting the passage of the input signal to the counting means when the reference signal is at its second level, digital display means, output lines carrying signals representing the count registered by the counting means, means responsive to the reference signal for conditioning the display means to display the count represented by the signals on the output lines when the reference signal is at its second level, additional counting means and additional gate means for diverting the input signal from the first named counting means to the additional counting means when the reference signal is at its first level until the count in the additional counting means reaches a predetermined level and thereafter applying the input signal to the first named counting means, and means for resetting the counting means to its initial level toward the end of each cycle of the reference signal.

2. In digital counting apparatus, an input terminal for receiving a pulsating input signal, means for providing a cyclical reference signal having a predetermined frequency, pulse counting means for counting the number of pulses applied thereto, means responsive to the reference signal for applying the input signal to the counting means during a first portion of each cycle of the reference signal and foı conditioning the display means to display during a second portion of each cycle the number of pulses counted by the counting means during the first portion of the cycle, the display means being turned off during the first portion of each cycle, additional counting means, gate means for applying the input signal to the additional counting means at the outset of the first portion of each cycle and then applying the signal to the first named counting means when the count in the additional counting means reaches a predetermined level, and means for resetting the counting means and additional counting means to initial levels at the end of the second portion of each cycle.

3. In counting apparatus for digitally displaying the operating frequency of a radio transmitter or receiver having a local oscillator operating at a predetermined frequency above the operating frequency, means for forming pulses at a rate corresponding to the frequency of the local oscillator, means for providing a cyclical reference signal having a repetitive waveform, first and second pulse counting means for counting the number of pulses applied thereto, means for applying the pulses to the first counting means during the first portion of each cycle of the reference signal, means for applying the pulses to the second counting means during a second portion of each cycle, digital display means, means for turning off the display means during the first and second portions of the cycle and conditioning the display means to display the count represented by the second counting means during a third portion of the cycle of the reference signal, and means for resetting the first and second counting means to initial levels at the end of the third portion.

4. In a method for digitally displaying the operating frequency of a radio transmitter or receiver having a local oscillator operating a predetermined frequency above the operating frequency, the steps of providing input pulses at a frequency corresponding to the frequency of the local oscillator, providing a cyclically varying reference signal having a repetitive waveform, counting the input pulses into a first counter during a first portion of each cycle of the reference signal until the count in said counter reaches a level corresponding to the predetermined frequency, counting the input pulses into a second counter during a second portion of each cycle of the reference signal, inhibiting the passage of pulses to the second counter during a third portion of each cycle of the reference signal, displaying the number of pulses previously registered in the second counter during the third portion of the cycle, and resetting the counters to their initial levels and turning off the display at the end of the third portion.

* * * * *